United States Patent
Fujikawa

(10) Patent No.: US 11,453,959 B2
(45) Date of Patent: Sep. 27, 2022

(54) CRYSTAL GROWTH APPARATUS INCLUDING HEATER WITH MULTIPLE REGIONS AND CRYSTAL GROWTH METHOD THEREFOR

(71) Applicant: SHOWA DENKO K.K., Tokyo (JP)

(72) Inventor: Yohei Fujikawa, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 17/072,466

(22) Filed: Oct. 16, 2020

(65) Prior Publication Data
US 2021/0130981 A1 May 6, 2021

(30) Foreign Application Priority Data

Oct. 30, 2019 (JP) .............................. JP2019-197404

(51) Int. Cl.
| | |
|---|---|
| *C30B 23/06* | (2006.01) |
| *C30B 35/00* | (2006.01) |
| *C30B 23/00* | (2006.01) |
| *C30B 29/36* | (2006.01) |

(52) U.S. Cl.
CPC .......... *C30B 35/002* (2013.01); *C30B 23/002* (2013.01); *C30B 23/06* (2013.01); *C30B 29/36* (2013.01)

(58) Field of Classification Search
CPC ....... C30B 23/00; C30B 23/002; C30B 23/02; C30B 23/06; C30B 23/063; C30B 23/066; C30B 29/00; C30B 29/10; C30B 29/36; C30B 35/00; C30B 35/002
USPC .... 117/84, 88, 101, 109, 200, 204, 937, 951
See application file for complete search history.

(56) References Cited

U.S. PATENT DOCUMENTS 4,632,817 A * 12/1986 Yazu ........................ B01J 3/062
117/41

FOREIGN PATENT DOCUMENTS

| JP | 2011-219294 A | | 11/2011 |
|---|---|---|---|
| JP | 2011219294 A | * | 11/2011 |

* cited by examiner

*Primary Examiner* — Kenneth A Bratland, Jr.
(74) *Attorney, Agent, or Firm* — Sughrue Mion, PLLC

(57) ABSTRACT

A crystal growth apparatus according to the present embodiment includes a crucible, a heater which is installed on an outward side of the crucible and surrounds the crucible, and a coil which is installed on an outward side of the heater and surrounds the heater, in which an inner surface of the heater on the crucible side includes a first region, and a second region which is further away from an outer side surface of the crucible than the first region is.

8 Claims, 5 Drawing Sheets

CRYSTAL GROWTH APPARATUS INCLUDING HEATER WITH MULTIPLE REGIONS AND CRYSTAL GROWTH METHOD THEREFOR

BACKGROUND OF THE INVENTION

Field of the Invention

The present invention relates to a crystal growth apparatus and a crystal growth method.

Priority is claimed on Japanese Patent Application No. 2019-197404 filed in Japan on Oct. 30, 2019, the content of which is incorporated herein by reference.

Description of Related Art

Compared to silicon (Si), silicon carbide (SiC) has a dielectric breakdown electric field that is one order of magnitude larger and three times the band gap. Also, silicon carbide (SiC) has characteristics such as about three times higher thermal conductivity compared to silicon (Si). Therefore, silicon carbide (SiC) is expected to be applied to power devices, high-frequency devices, high-temperature operating devices, or the like. Therefore, in recent years, SiC epitaxial wafers have come to be used for the semiconductor devices described above.

SiC epitaxial wafers are manufactured by growing a SiC epitaxial film, which serves as an active region of a SiC semiconductor device, on a SiC single crystal substrate using a chemical vapor deposition (CVD) method.

SiC single crystal substrates are manufactured by cutting a SiC single crystal. The SiC single crystal can be generally obtained by a sublimation method. A sublimation method is a method of growing a seed crystal into a larger SiC single crystal by disposing the seed crystal made of a SiC single crystal on a pedestal disposed in a graphite crucible and supplying the seed crystal with a sublimation gas, which is sublimated from raw material powder included in the crucible, by heating the crucible.

In recent years, according to market demand, there has been growing demand for a SiC single crystal having a large diameter and an elongated length. Also, along with the demand for a larger diameter and an elongated length of the SiC single crystal, higher quality of the SiC single crystal and improvement of production efficiency have been also demanded.

Patent Document 1 describes a SiC single crystal manufacturing apparatus in which heaters surrounding a periphery of a crucible are separated in a height direction and a rod-shaped member or an intermediate heat insulating material is provided between the separated heaters. The separated heaters are thermally separated from each other by the rod-shaped member or the intermediate heat insulating material.

Patent Document
Patent Document 1: Japanese Unexamined Patent Application, First Publication No. 2011-219294

SUMMARY OF THE INVENTION

In a crucible, when a temperature difference between the temperature on a raw material side in which the raw material sublimates and the temperature on a seed crystal side in which a sublimation gas is recrystallized increases, the growth rate of a SiC single crystal increases. Even when the heaters are separated as in the SiC single crystal manufacturing apparatus described in Patent Document 1, radiation from each heater reaches the crucible which is heated, and a sufficiently large temperature difference in the crucible cannot be achieved. Also, due to the separated heaters, the number of parts of the apparatus increases, and the workability decreases.

The present invention has been made in view of the above-described problems, and an objective of the present invention is to provide a crystal growth apparatus and a crystal growth method capable of controlling a temperature distribution in the crucible.

The present invention provides the following methods in order to solve the above problems.

(1) A crystal growth apparatus according to a first aspect includes a crucible, a heater which is installed on an outward side of the crucible and surrounds the crucible, and a coil which is installed on an outward side of the heater and surrounds the heater, in which an inner surface of the heater on the crucible side includes: a first region, and a second region which is further away from an outer side surface of the crucible than the first region is.

(2) In the crystal growth apparatus according to the above-described aspect, the inner surface of the heater may have a step between the first region and the second region.

(3) In the crystal growth apparatus according to the above-described aspect, the inner surface of the heater may be continuously and smoothly connected between the first region and the second region.

(4) In the crystal growth apparatus according to the above-described aspect, the crucible may include a raw material setting region and a crystal setting part therein, the raw material setting region and the crystal setting part face each other, the first region surrounds the crystal setting part, and the second region surrounds a circumference of the raw material setting region.

(5) In the crystal growth apparatus according to the above-described aspect, a shortest distance between the second region and the outer side surface of the crucible may be twice a shortest distance between the first region and the outer side surface of the crucible or more.

(6) A crystal growth method according to a second aspect is a crystal growth method which uses a crystal growth apparatus including a crucible, a heater which is installed on an outward side of the crucible and surrounds the crucible, and a coil which is installed on an outward side of the heater and surrounds the heater, wherein the crystal growth method includes: controlling the amount of radiation, which reaches the crucible from the heater, by changing the distance between the heater and the crucible according to a position of the apparatus.

According to the crystal growth apparatus and the crystal growth method according to the above-described aspects, the temperature distribution in the crucible can be controlled.

DETAILED DESCRIPTION OF THE INVENTION

Figure 1:
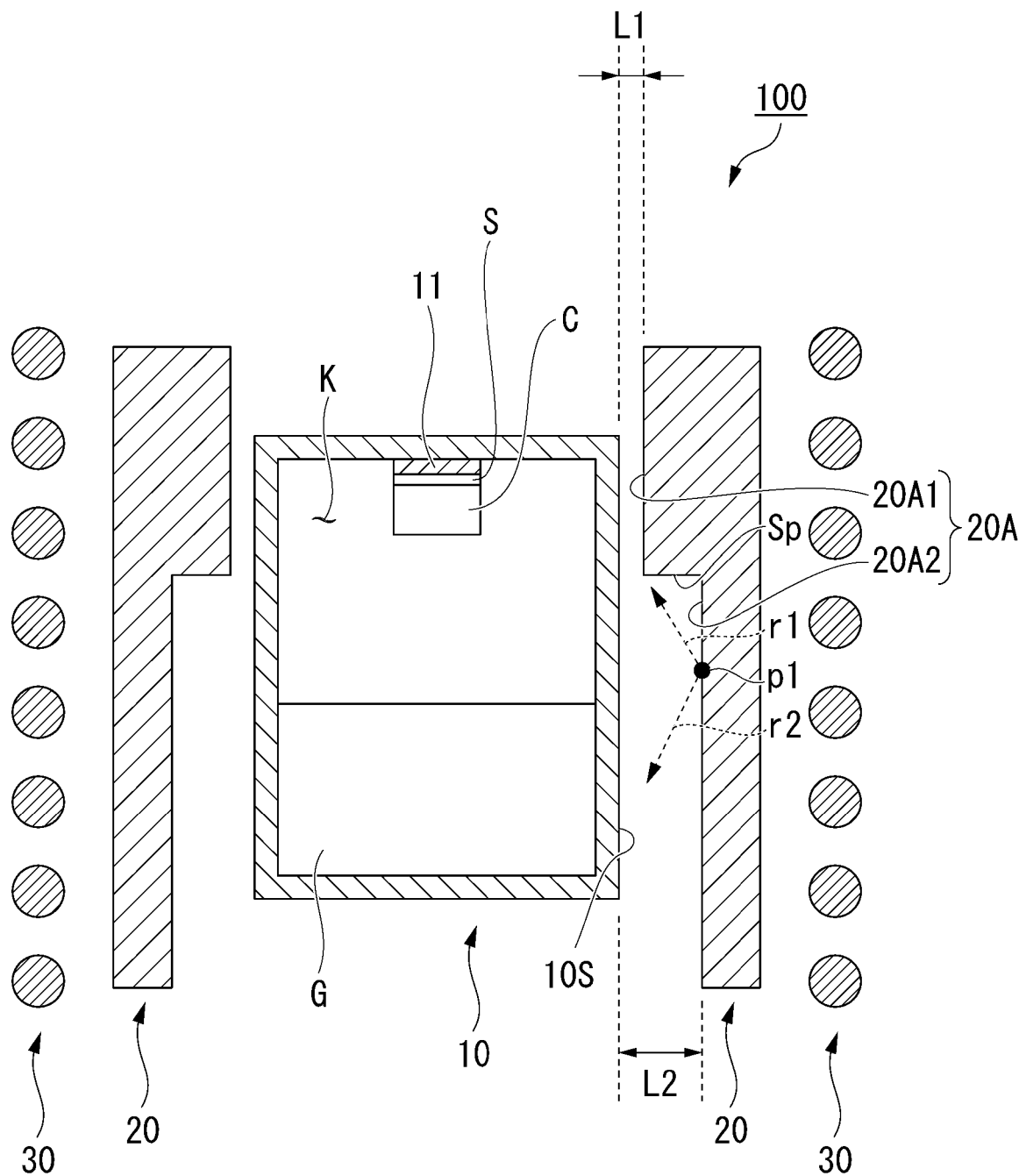
FIG. 1 is a schematic cross-sectional view illustrating an example of a crystal growth apparatus according to a first embodiment.

Hereinafter, preferred present embodiments and examples of a crystal growth apparatus and a crucible of the present invention will be described in detail with reference to the drawings as appropriate. In the drawings used in the following description, there are cases in which characteristic portions are appropriately enlarged for convenience of illustration so that characteristics of the present invention can be easily understood, and dimension and proportions of respective constituent elements may be different from actual ones. Materials, dimensions, and the like illustrated in the following description are merely examples, and the present invention is not limited thereto and can be implemented with appropriate modifications within a range not changing the gist of the present invention. For example, additions, omissions, substitutions, and other changes can be made to the numbers, amounts, positions, sizes, types, ratios, or the like without departing from the spirit of the present invention.

(Crystal Growth Apparatus)

FIG. 1 is a schematic cross-sectional view of a crystal growth apparatus according to a first embodiment. A crystal growth apparatus 100 illustrated in FIG. 1 includes a crucible 10, a heater 20, and a coil 30. In FIG. 1, in order to facilitate understanding, a raw material G, a seed crystal S, and a single crystal C grown on the seed crystal S are illustrated at the same time.

First, directions will be defined. A direction from the raw material G to the seed crystal S in the crucible 10 is referred to as a z direction. Also, a direction perpendicular to the z direction and extending from a center of the crucible 10 is referred to as a radial direction. FIG. 1 is a cross-sectional view taken along an arbitrary cross section along a central axis of the crucible 10.

The crucible 10 is a columnar body having a crystal growth space K therein in which a single crystal C undergoes crystal growth. The crucible 10 may have, for example, a columnar shape. The crucible 10 is separable in the z direction, and the raw material G and the seed crystal S can be set therein. When the single crystal C undergoes crystal growth using a sublimation method, the raw material G is filled in a bottom portion of the crucible 10. A crystal setting part 11 is located on an upper portion of the crucible 10, wherein the upper portion is facing the raw material G. The crystal setting part 11 faces the raw material G. When the single crystal C undergoes crystal growth using a sublimation method, the seed crystal S is set in the crystal setting part 11. A raw material gas sublimated from the raw material G is recrystallized on a surface of the seed crystal S, and thereby the single crystal C grows.

The crucible 10 is made of a material that can withstand a high temperature at the time of growing the single crystal C. The crucible 10 may be, for example, graphite. Graphite has an extremely high sublimation temperature of 3550° C. and can withstand a high temperature during crystal growth.

The heater 20 is located on an outward side of the crucible 10. The heater 20 may surround, for example, a periphery of the crucible 10. The heater 20 is positioned between the coil 30 and the crucible 10 in the radial direction. The heater 20 may have, for example, a cylindrical shape extending in the z direction. The height of the heater 20 in the z direction may be, for example, larger than the height of the crucible 10 in the z direction. The heater 20 receives a magnetic field generated by the coil 30 and is induction-heated. Radiation from the heater 20 that has generated heat heats the crucible 10. The crucible 10 is indirectly heated by the heater 20. The heater 20 may be made of, for example, graphite, TaC, TaC-coated graphite, or the like.

An inner surface 20A of the heater 20 faces an outer side surface 10S of the crucible 10. The inner surface 20A of the heater 20 illustrated in FIG. 1 is divided into a first region 20A1 and a second region 20A2. The first region 20A1 is a portion of the inner surface 20A that is separated from the outer side surface 10S of the crucible 10 by a distance L1. The second region 20A2 is a portion of the inner surface 20A that is separated from the outer side surface 10S of the crucible 10 by a distance L2. The heater 20 illustrated in FIG. 1 has one step Sp between the first region 20A1 and the second region 20A2. Due to the step, the inner surface 20A has two different inner diameters.

The second region 20A2 is further away from the outer side surface 10S of the crucible 10 than the first region 20A1 is. The distance L2 between the second region 20A2 and the outer side surface 10S of the crucible 10 is larger than the distance L1 between the first region 20A1 and the outer side surface 10S of the crucible 10. The distance L2 between the second region 20A2 and the outer side surface 10S of the crucible 10 is preferably twice the distance L1 between the first region 20A1 and the outer side surface 10S of the crucible 10 or more, and more preferably four times or more. The upper limit of L2/L1 can be arbitrarily selected and may be, for example, 1000 times or less, 200 times or less, 50 times or less, or 10 times or less.

The distance L1 between the first region 20A1 and the outer side surface 10S of the crucible 10 may be, for example, 0.1 mm or more and 50 mm or less, preferably 1 mm or more and 20 mm or less, and more preferably 5 mm or more and 15 mm or less. Also, the distance L2 between the second region 20A2 and the outer side surface 10S of the crucible 10 may be, for example, 10 mm or more and 200 mm or less, preferably 20 mm or more and 150 mm or less, and more preferably 30 mm or more and 100 mm or less.

The first region 20A1 and the second region 20A2 are at different positions in the z direction. The first region 20A1 may surround, for example, an upper side of the crucible 10. The first region 20A1 may surround, for example, a periphery of the crystal setting part 11 of the crucible 10. The first region 20A1 may be located, for example, on the crystal setting part 11 side from a height center of the heater 20 in the z direction. The second region 20A2 may surround, for example, a lower side of the crucible 10. The second region 20A2 may surround, for example, a periphery of a raw material setting region of the crucible 10 in which the raw material G is filled. The second region 20A2 may be located, for example, on the raw material setting region side from the height center of the heater 20 in the z direction.

The coil 30 is on an outward side of the heater 20. The coil 30 is wound around the crucible 10 and the heater 20. When a current is caused to flow in the coil 30, a magnetic field is generated on an inward side of the coil 30. The generated magnetic field generates an induced current in the heater 20. The heater 20 generates heat due to the induced current and is induction-heated. The coil 30 may be, for example, a single coil and made of one continuous wire.

The crystal growth apparatus 100 according to the first embodiment can be configured such that a temperature distribution of the crucible 10 in the z direction is large.

Figure 2:
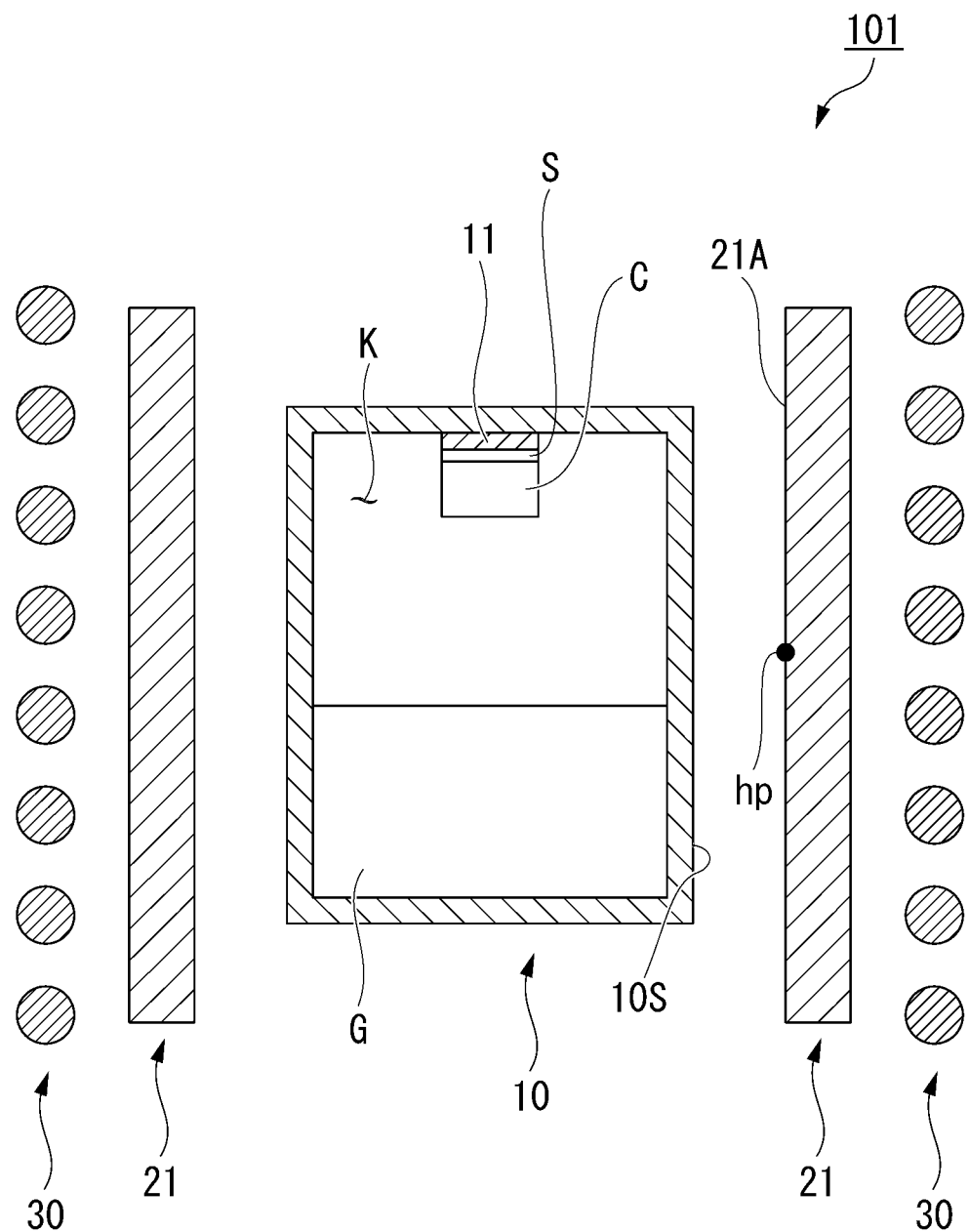
FIG. 2 is a schematic cross-sectional view of a crystal growth apparatus according to a comparative example.

FIG. 2 is a schematic cross-sectional view of a crystal growth apparatus 101 according to comparative example 1. The crystal growth apparatus 101 according to comparative example 1 is different from the crystal growth apparatus 100 according to the first embodiment in that a distance between an inner surface 21A of a heater 21 and the outer side surface 10S of the crucible 10 is constant at any position in the z direction. Other configurations are the same as those of the example illustrated in FIG. 1.

In a case of the crystal growth apparatus 101 according to comparative example 1, the inner surface 21A of the heater 21 and the outer side surface 10S of the crucible 10 face each other substantially in parallel. Radiation generated from any position of the heater 21 can reach the outer side surface 10S of the crucible 10. For example, when the heater 21 has a uniform thickness and length, a center of the heater 21 in the z direction is a heating center hp. Radiation that spreads in an isotropic manner from the heating center hp reaches any position on the outer side surface 10S of the crucible 10, and the outer side surface 10S of the crucible 10 is uniformly heated.

On the other hand, in the crystal growth apparatus 100 according to the first embodiment, a distance between the inner surface 20A of the heater 20 and the outer side surface 10S of the crucible 10 differs according to a portion. Therefore, radiation cannot reach the outer side surface 10S of the crucible 10 depending on a generation portion of the radiation of the heater 20. For example, of the radiation that spreads in the isotropic manner from a first point p1 of the second region 20A2, a radiation r1 which goes toward the crystal setting part 11 side does not reach the outer side surface 10S of the crucible 10 wherein the surface is in a shadow of the step Sp, but a radiation r2 which goes toward the raw material setting region side reaches the outer side surface 10S of the crucible 10. The temperature of the crucible 10 on the raw material setting region side receiving radiation from a large number of positions of the heater 20 is higher than the temperature thereof on the crystal setting part 11 side, and thereby a temperature gradient is formed on the side surface of the crucible 10.

When the temperature of the crucible 10 on the raw material setting region side is higher than the temperature thereof on the crystal setting part 11 side, sublimation of the raw material G is promoted and recrystallization of the single crystal C is promoted. Therefore, the crystal growth apparatus 100 according to the first embodiment can increase the growth rate of the single crystal C.

While the preferred embodiment of the present invention has been described above, the present invention is not limited to such a specific embodiment, and various modifications and changes can be made within the gist of the present invention described in the claims.

Figure 3:
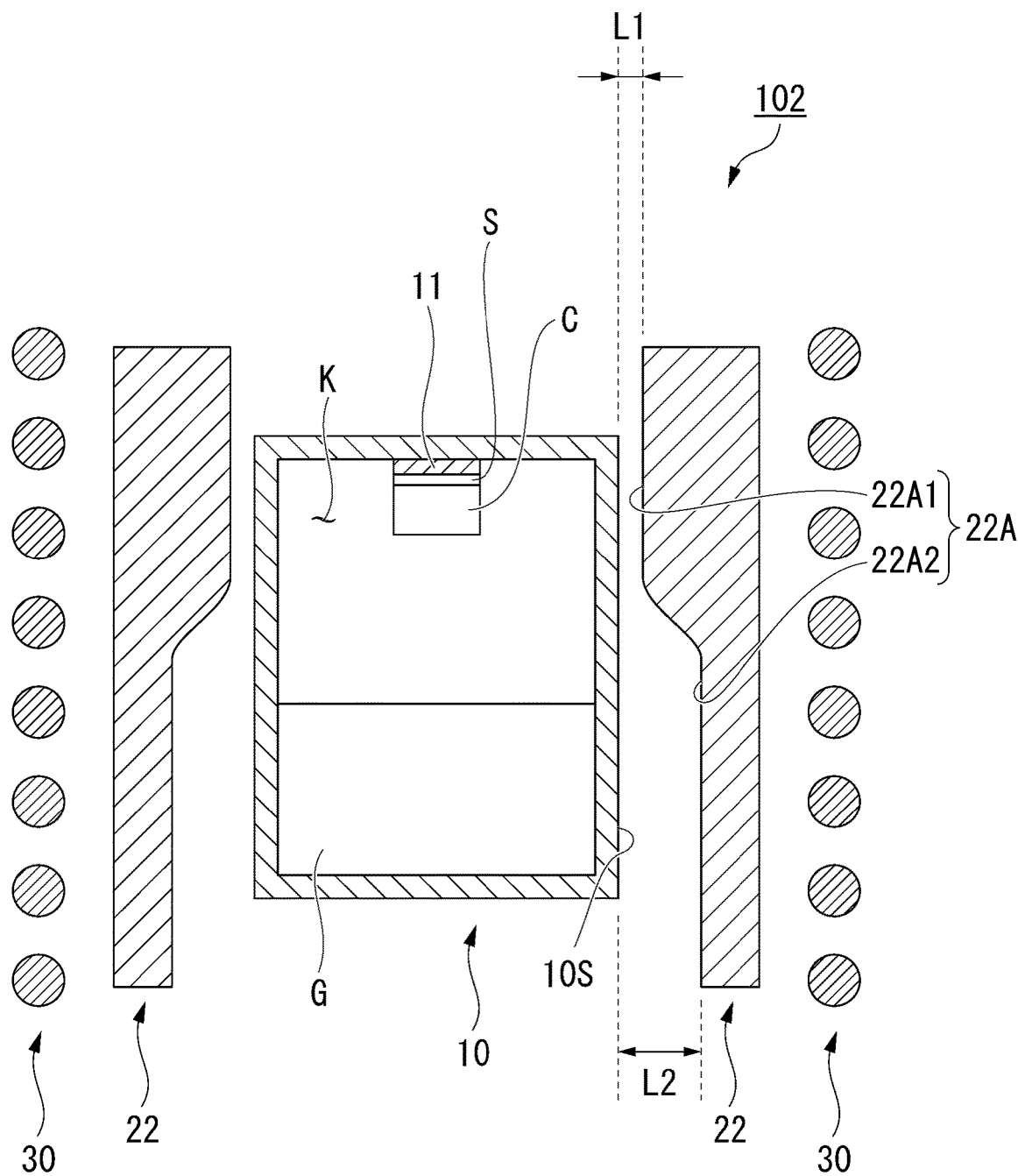
FIG. 3 is a schematic cross-sectional view illustrating an example of a crystal growth apparatus according to a first modified example.

FIG. 3 is a schematic cross-sectional view illustrating an example of a crystal growth apparatus according to a first modified example. A crystal growth apparatus 102 according to the first modified example is different from the crystal growth apparatus 100 illustrated in FIG. 1 in a shape of a heater 22. In FIG. 3, constituents the same as those in FIG. 1 will be denoted by the same references and a description thereof will be omitted.

An inner surface 22A of the heater 22 has a first region 22A1 and a second region 22A2. The first region 22A1 and the second region 22A2 correspond to the first region 20A1 and the second region 20A2 of FIG. 1. In the heater 22 illustrated in FIG. 3, the first region 22A1 and the second region 22A2 are smoothly and continuously connected. "Continuous connection of the first region 22A1 and the second region 22A2" means that a step is not formed between the regions and an inclination of a tangential plane thereof continuously changes in the z direction. Due to such smooth coupling, the inner surface 22A has two different inner diameters and an inner diameter that changes gradually therebetween.

Further, in regard to a position with respect to the crucible 10 and a distance from the outer side surface 10S of the crucible 10, the first region 22A1 and the second region 22A2 may have the same conditions and the same distance relationships as those of the first region 20A1 and the second region 20A2 illustrated in FIG. 1.

The crystal growth apparatus 102 according to the first modified example achieves the same effects as in the crystal growth apparatus 100 according to the first embodiment.

Figure 4:
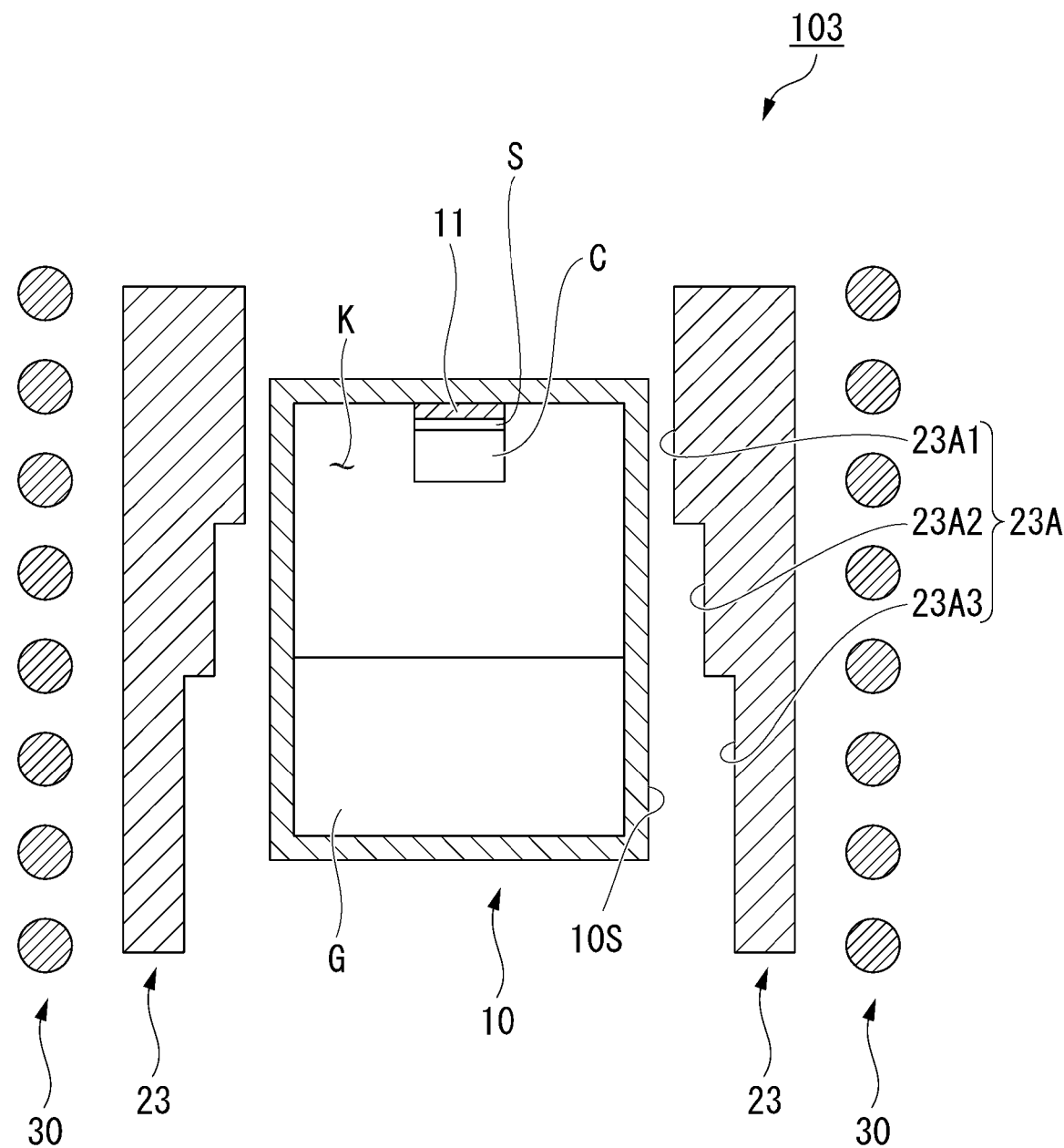
FIG. 4 is a schematic cross-sectional view illustrating an example of a crystal growth apparatus according to a second modified example.

FIG. 4 is a schematic cross-sectional view illustrating an example of a crystal growth apparatus according to a second modified example. A crystal growth apparatus 103 according to the second modified example is different from the crystal growth apparatus 100 illustrated in FIG. 1 in a shape of a heater 23. In FIG. 4, the number of steps of the heater 23 is two. In FIG. 4, constituents the same as those in FIG. 1 will be denoted by the same references and a description thereof will be omitted.

An inner surface 23A of the heater 23 has a first region 23A1, a second region 23A2, and a third region 23A3. The first region 23A1, the second region 23A2, and the third region 23A3 each have a different distance from the outer side surface 10S of the crucible 10. The second region 23A2 is further away from the outer side surface 10S of the crucible 10 than the first region 23A1 is, and the third region 23A3 is further away from the outer side surface 10S of the crucible 10 than the second region 23A2 is. The inner surface 23A has three different inner diameters.

Further, in regard to a position with respect to the crucible 10 and a distance from the outer side surface 10S of the crucible 10, the first region 23A1 and the third region 23A3 may have the same conditions and the same distance relationships as those of the first region 20A1 and the second region 20A2 illustrated in FIG. 1.

A position and a condition of the second region 23A2 may be selected to be being positioned between the first region 23A1 and the third region 23A3. Also, the second region 23A2 may or may not surround a periphery of the crystal setting part 11 and may or may not surround a part of a periphery of the raw material setting region.

The crystal growth apparatus 103 according to the second modified example achieves the same effects as in the crystal growth apparatus 100 according to the first embodiment.

(Crystal Growth Method)

A crystal growth method according to a second embodiment is a crystal growth method using a crystal growth apparatus including a crucible, a heater, and a coil. The heater is located on an outward side of the crucible and surrounds the crucible. The coil is located on an outward side of the heater and surrounds the heater. The crystal growth method according to the second embodiment controls an amount of radiation reaching the crucible from the heater by changing a distance between the heater and the crucible depending on a portion thereof.

As the heater and the crucible are brought closer to each other, it becomes more difficult for radiation to be transmitted to an outer side surface of the crucible and a temperature of the crucible becomes lower. On the other hand, when the distance between the heater and the crucible is increased, radiation reaches the outer side surface of the crucible and a temperature of the crucible increases. As in the crystal growth apparatus according to the first embodiment, when a distance between the outer side surface 10S of the crucible 10 and the inner surface 20A of the heater 20 on the crystal setting part 11 side is brought closer than a distance between the outer side surface 10S of the crucible 10 and the inner surface 20A of the heater 20 on the raw material setting region side, a temperature of the crucible 10 on the crystal setting part 11 side is lower than a temperature of the raw material setting region side. For example, in a case of growing a SiC single crystal using a sublimation method, it is useful to make a temperature around the seed crystal lower than a temperature of the raw material. Also, the present invention is not limited to this case, and when there are circumstances in which a temperature in the crucible is desired to be changed for various reasons, the temperature in the crucible can be controlled by the distance between the heater and the crucible.

EXAMPLES

Example 1

The configuration illustrated in FIG. 1 was reproduced by simulation, and a temperature of the side surface of the crucible when the crucible was heated was obtained. For the simulation, Virtual Reactor manufactured by STR was used. The simulation is widely used for simulation of a temperature distribution in a furnace and has been ascertained to have a high correlation with actual experimental results.

The simulation was calculated using a model for a two-dimensional axis, and the simulation conditions were as follows.

Distance between the outer side surface 10S of the crucible 10 and the first region 20A1: 10 mm
Inner diameter in the radial direction of the heater 20 in the first region 20A1: 270 mm
Width (thickness) in the radial direction of the heater 20 in the first region 20A1: 85 mm
Length in the z direction of the crucible 10 in the first region 20A1: 130 mm
Distance between the outer side surface 10S of the crucible 10 and the second region 20A2: 45 mm
Inner diameter in the radial direction of the heater 20 in the second region 20A2: 340 mm
Width (thickness) in the radial direction of the heater 20 in the second region 20A2: 50 mm
Length in the z direction of the crucible 10 in the second region 20A2: 240 mm Example 2

Example 2 differs from example 1 in that the following conditions are changed. Other conditions were set to be the same as those in example 1 and a simulation was performed.
Distance between the outer side surface 10S of the crucible 10 and the second region 20A2: 65 mm
Inner diameter in the radial direction of the heater 20 in the second region 20A2: 380 mm
Width (thickness) in the radial direction of the heater 20 in the second region 20A2: 30 mm Comparative Example 1

In comparative example 1, the configuration illustrated in FIG. 2 was reproduced by simulation, and a temperature of the side surface of the crucible when the crucible was heated was determined. Conditions of the simulation in comparative example 1 are shown below.

Figure 5:
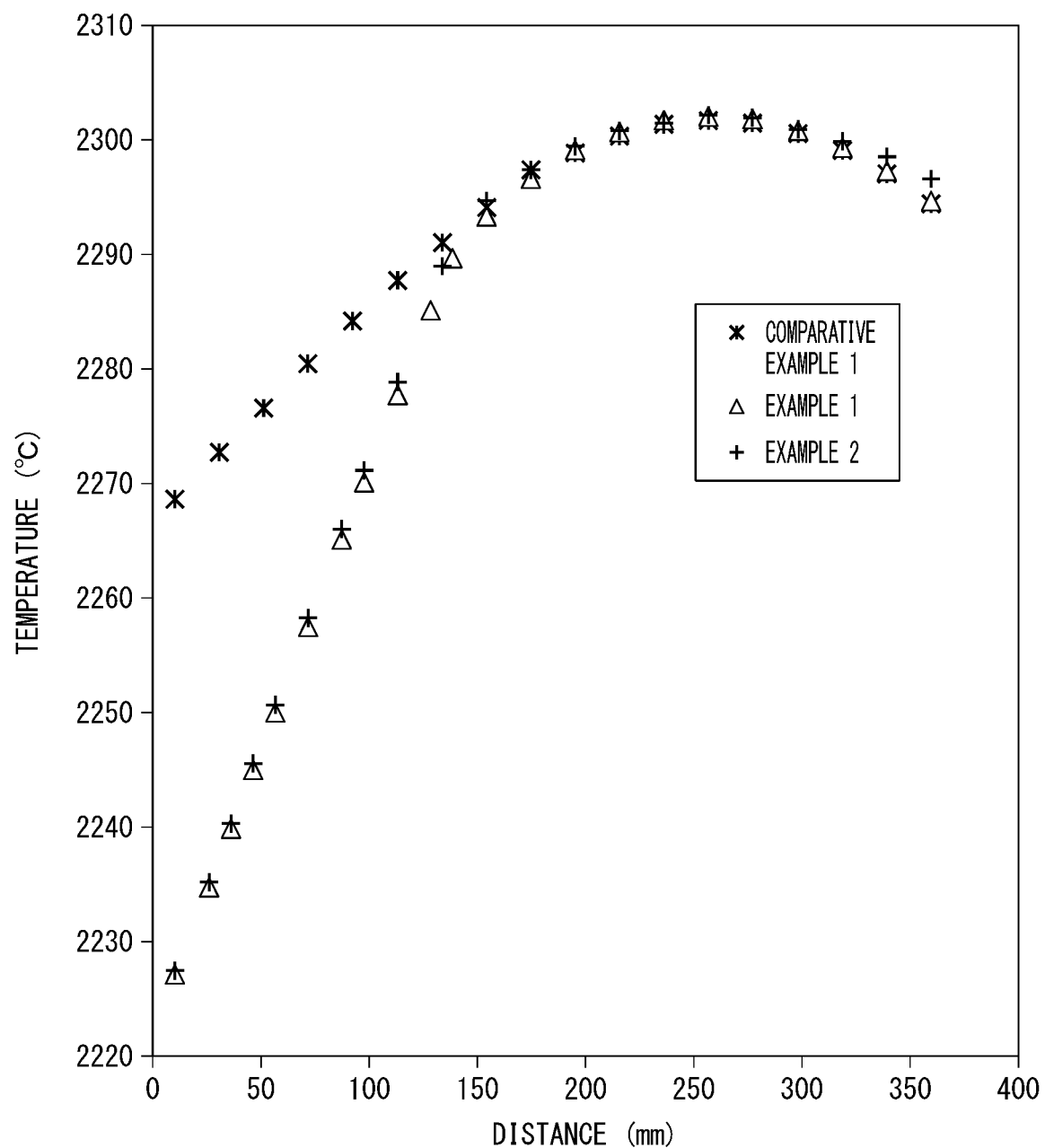
FIG. 5 is a view showing simulation results of example 1, example 2, and comparative example 1.

Distance between the outer side surface 10S of the crucible 10 and the inner surface 21A: 45 mm
Inner diameter in the radial direction of the heater 21 in the inner surface 21A: 340 mm
Width (thickness) in the radial direction of the heater 21 in the inner surface 21A: 50 mm Results of example 1, example 2, and comparative example 1 are shown in FIG. 5. A vertical axis of FIG. 5 represents a temperature of the outer side surface 10S of the crucible 10, and a horizontal axis of FIG. 5 represents a distance from an uppermost surface of the crucible 10 in the −z direction. As shown in FIG. 5, temperature changes in the z direction in example 1 and example 2 were larger than that in comparative example 1. The temperature of the outer side surface 10S of the crucible 10 significantly decreased particularly at positions overlapping the first region 20A1 in the z direction.

EXPLANATION OF REFERENCES

10 Crucible
10S Outer side surface
11 Crystal setting part
20, 21, 22, 23 Heater
20A, 21A, 22A, 23A Inner surface
20A1, 21A1, 22A1, 23A1 First region
20A2, 21A2, 22A2, 23A2 Second region
23A3 Third region
30 Coil
100, 101, 102, 103 Crystal growth apparatus
C Single crystal
G Raw material
hp Heating center
K Crystal growth space
L1, L2 Distance
p1 First point
r1, r2 Radiation
S Seed crystal
Sp Step

What is claimed is:
1. A crystal growth apparatus comprising:
a crucible;
a heater which is installed on an outward side of the crucible and surrounds the crucible; and
a coil which is installed on an outward side of the heater and surrounds the heater,
wherein
an inner surface of the heater on a crucible side includes:
a first region facing an upper portion of the crucible, and
a second region facing a vertically lower portion of the crucible, wherein the second region is further away in a horizontal direction from an outer side surface of the crucible than the first region,
wherein the inner surface of the heater has a step between the first region and the second region, and a radiation which goes from the second region toward the upper portion of the crucible is shielded by the step.
2. The crystal growth apparatus according to claim 1, wherein the inner surface of the heater is continuously and smoothly connected between the first region and the second region.
3. The crystal growth apparatus according to claim 1, wherein the crucible includes a raw material setting region and a crystal setting part therein, the raw material setting region and the crystal setting part face each other, the first region surrounds the crystal setting part, and the second region surrounds the raw material setting region.

4. The crystal growth apparatus according to claim 1, wherein a shortest distance between the second region and the outer side surface of the crucible is twice a shortest distance between the first region and the outer side surface of the crucible or more.

5. A crystal growth method which uses a crystal growth apparatus including:
- a crucible;
- a heater which is installed on an outward side of the crucible and surrounds the crucible; and
- a coil which is installed on an outward side of the heater and surrounds the heater, wherein
- an inner surface of the heater on a crucible side includes:
  - a first region facing an upper portion of the crucible, and a second region facing a vertically lower portion of the crucible,
- wherein the inner surface of the heater has a step between the first region and the second region, and a radiation which goes from the second region toward the upper portion of the crucible is shielded by the step the crystal growth method comprising:
controlling an amount of radiation which reaches the crucible from the heater by setting the second region to be further away in a horizontal direction from an outer side surface of the crucible than the first region.

6. The crystal growth method according to claim 5, wherein the first region and the second region are continuously and smoothly connected.

7. The crystal growth method according to claim 5, wherein the crucible includes a raw material setting region and a crystal setting part therein, the raw material setting region and the crystal setting part face each other, the first region surrounds the crystal setting part, and the second region surrounds the raw material setting region.

8. The crystal growth method according to claim 5, wherein a shortest distance between the second region and the outer side surface of the crucible is twice a shortest distance between the first region and the outer side surface of the crucible or more.

* * * * *